United States Patent
Benaissa et al.

(10) Patent No.: US 7,053,465 B2
(45) Date of Patent: May 30, 2006

(54) SEMICONDUCTOR VARACTOR WITH REDUCED PARASITIC RESISTANCE

(75) Inventors: Kamel Benaissa, Richardson, TX (US); Chi-Cheong Shen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/994,421

(22) Filed: Nov. 27, 2001

(65) Prior Publication Data

US 2002/0074589 A1    Jun. 20, 2002

Related U.S. Application Data

(60) Provisional application No. 60/253,620, filed on Nov. 28, 2000.

(51) Int. Cl.
  *H01L 29/76*    (2006.01)

(52) U.S. Cl. .................. 257/595; 257/312; 257/600; 438/379

(58) Field of Classification Search ............... 257/312, 257/480, 595–602; 438/227–228, 233, 585, 438/379; 361/277–278
See application file for complete search history.

(56) References Cited

U.S. PATENT DOCUMENTS

| | | | |
|---|---|---|---|
| 5,910,673 A | * | 6/1999 | Hsu et al. .................. 257/355 |
| 6,316,805 B1 | * | 11/2001 | Lin et al. .................. 257/328 |
| 6,351,020 B1 | * | 2/2002 | Tarabbia et al. ........... 257/532 |

\* cited by examiner

*Primary Examiner*—Kenneth Parker
*Assistant Examiner*—José R. Diaz
(74) *Attorney, Agent, or Firm*—Peter K. McLarty; W. James Brady, III; Frederick J. Telecky, Jr.

(57) ABSTRACT

A semiconductor varactor with reduced parasitic resistance. A contact isolation structure (32) is formed in a well region (20). The gate contact structures (70) are formed above the contact isolation structure (32) reducing the parasitic resistance. In addition, contact structures are formed on the gate layer (50) over the well regions (20) is a further embodiment to reduce the parasitic resistance.

7 Claims, 3 Drawing Sheets

SEMICONDUCTOR VARACTOR WITH REDUCED PARASITIC RESISTANCE

This application claims priority under 35 USC § 119(e)(1) of provisional application Ser. No. 60/253,620, filed Nov. 28, 2000.

FIELD OF THE INVENTION

The present invention relates to a method of forming a metal oxide semiconductor varactor using CMOS technology.

BACKGROUND OF THE INVENTION

In mixed signal applications it is sometimes necessary to have varactors as a part of the CMOS integrated circuit. A varactor is a capacitor whose capacitance value depends on the voltage applied to the capacitor. Typical integrated circuit varactors comprise metal oxide semiconductor (MOS) structures. The capacitor in a MOS structure is formed by the gate electrode (or gate), the gate dielectric layer and the semiconductor substrate. The gate will form one terminal of the capacitor and the semiconductor substrate will form the other terminal. Voltage applied across the gate and the semiconductor substrate will change the value of the capacitor. An important property of a MOS varactor is the ratio of the maximum capacitance of the varactor to the minimum value of capacitance or $V_R = C_{max}/C_{min}$. Here $C_{max}$ represents the maximum varactor capacitance, $C_{min}$ the minimum varactor capacitance, and $V_R$ the varactor capacitance ratio. A number of factors will affect $V_R$ including gate dielectric thickness, substrate doping, gate electrode doping, series resistance, and frequency of operation. A number of these factors such as gate dielectric thickness, substrate doping, and gate electrode doping also affect the MOS transistors which comprise the integrated circuit and cannot be varied to maximize the capacitance ratio $V_R$. Given the constraint imposed by the other devices comprising the integrated circuit a method is needed to increase the varactor capacitance ratio $V_R$ without affecting the other integrated circuit devices present.

SUMMARY OF INVENTION

The instant invention describes a semiconductor varactor with reduced parasitic resistance. In an embodiment of the invention, a contact isolation structure is formed in a well region. The contacts to the gate layer of the semiconductor are formed over the contact isolation structure thereby reducing the parasitic resistance of the semiconductor structure. This reduction in parasitic resistance results in an increase in the capacitance ratio of the structure compared to the prior art. In another embodiment of the invention, the gate contact is formed over the well region of the semiconductor structure.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
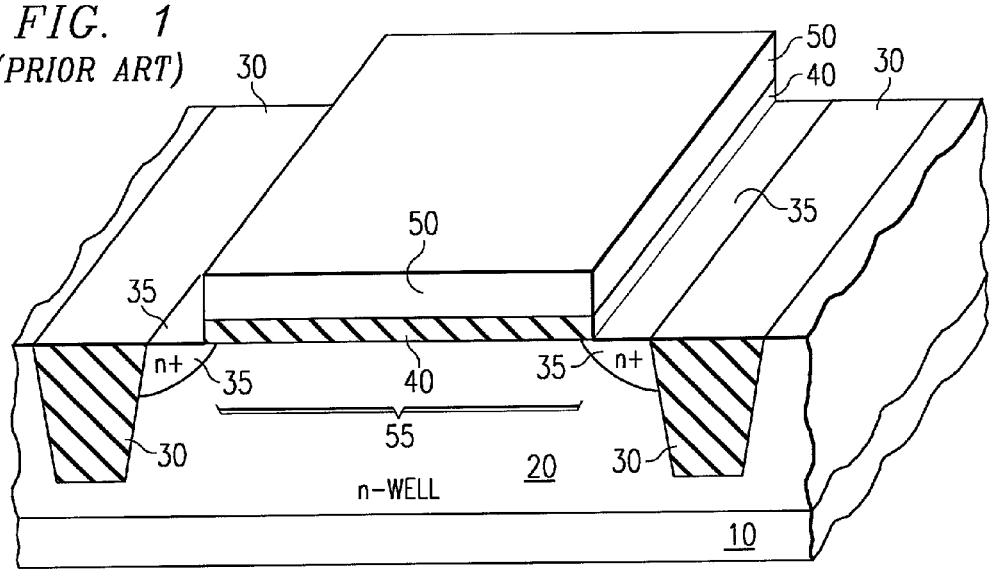
FIG. 1 is cross-section diagram of a portion of an integrated circuit showing a typical MOS varactor.

Illustrated in FIG. 1 is a MOS varactor according to the prior art. A n-well region is formed in a p-type semiconductor substrate 10. The n-well region 20 can be formed by implanting n-type dopant species into a region of the p-type substrate. Examples of typical n-type dopant which would be suitable for forming the n-well region 20 are arsenic and phosphorous. The choice of suitable n-type dopants is not however limited to these two species and any n-type dopant species could be used. Isolation structures 30 are formed in the n-well region 20. These isolation structures comprise insulating materials such as silicon oxide and silicon nitride and can be formed using shallow trench isolation (STI) or localized oxidation (LOCOS) techniques. The isolation structure 30 shown in FIG. 1 is STI. STI structures are typically formed by first forming a trench in the substrate which is then filled with an insulating material usually comprising silicon oxide. In some instances the isolation structures 30 will be formed in the substrate before the n-well region is formed. A gate dielectric layer 40 is then formed on the surface of the substrate. This gate dielectric layer 40 can comprise a material selected from the group consisting of silicon oxide, silicon oxynitride, a silicate, and silicon nitride. In addition alternate layers of these different materials can also be used to form the gate dielectric layer.

Following the formation of the gate dielectric layer 40, a gate electrode layer (or gate layer) 50 is formed over the gate dielectric layer 40. This gate layer is a conductive layer and usually comprises doped polycrystalline silicon or doped amorphous silicon. In some instances a silicide layer will be formed on the gate layer 50. Following the formation of the gate layer 50, the heavily doped contact regions 35 are formed. These contact regions 35 are formed by implanting additional n-type dopants into n-well region 20. These heavily doped contact regions 35 will be used to contact the n-well region which will form one terminal of the varactor. In typical CMOS processes, these heavily doped contact regions will be formed using the source and drain region implantation process and the source and drain extension region implantation process. The structure shown in FIG. 1 forms a varactor with an active area 55. To contact the gate of varactor, contacts are formed to the gate layer 50 outside of the active area 55. In general, a dielectric layer (usually called a PMD layer) will be formed over the gate layer 50. Contact holes will then be formed in the PMD layer and filled with a conducting material usually referred to as a plug. Tungsten is often used to form these plugs. This conducting material is used to make contact with the underlying gate layer 50. These additional structures are omitted from FIG. 1 for clarity. The structure of FIG. 1 has a relatively low Q factor due to high parasitic series resistance.

Figure 2A:
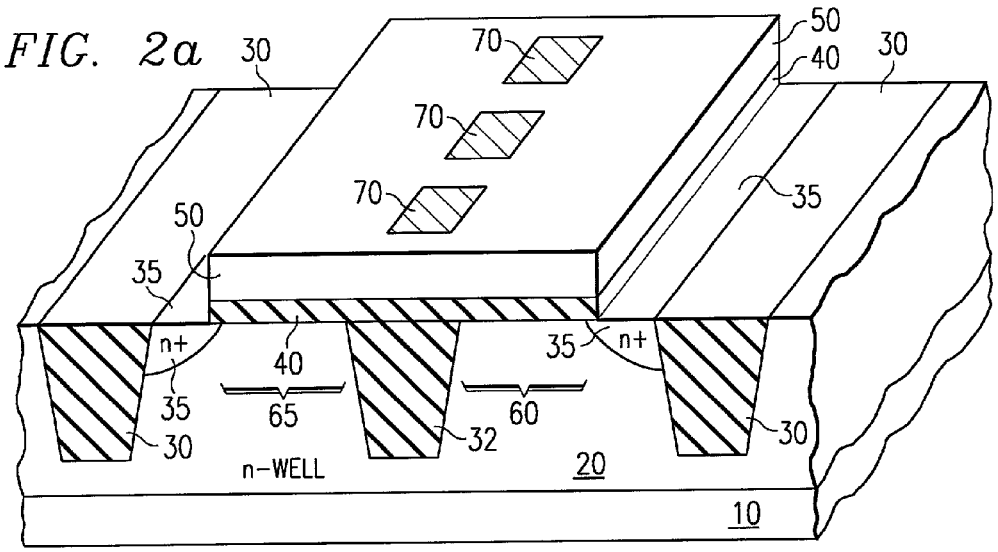
FIGS. 2(a) and 2(b) are cross-section diagrams showing a MOS varactor according to an embodiment of the instant invention.
Figure 2B:
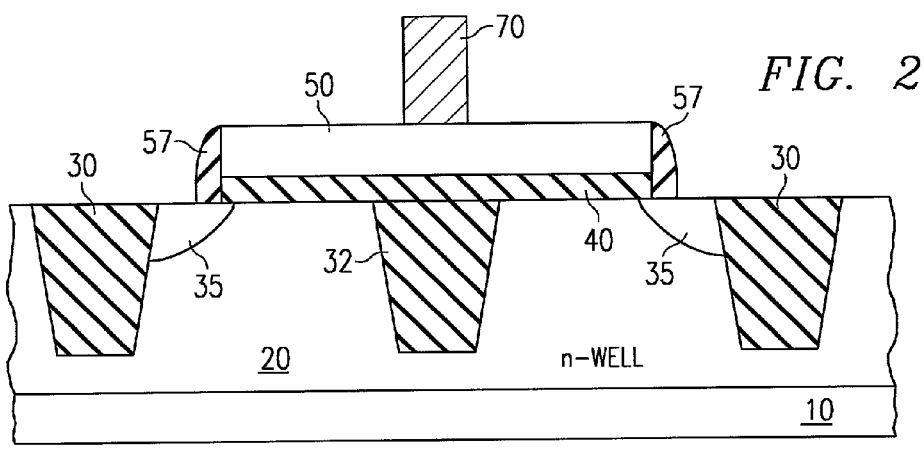

Shown in FIGS. 2(a) and 2(b) are cross-section diagrams of a varactor formed according to an embodiment of the instant invention. As described above, a n-well region 20 and isolation structures 30 are formed in a p-type silicon substrate 10. An additional contact isolation structure 32 is formed in the n-well region resulting in the formation of active areas 60 and 65. A gate dielectric layer 40 and a gate layer 50 are then formed over the well region 20 and the contact isolation structure. The heavily doped contact regions 35 are then formed on the surface of the substrate as described above. In forming the heavily doped contact region 35, the implant processes used to form the source and drain of NMOS transistors, also present on the integrated circuit, can be used. In addition to heavily doped source and drain regions, NMOS transistors also have more lightly doped drain and source extension regions. In forming these NMOS transistor drain and source extension regions, n-type dopant species are implanted after the gate region of the NMOS transistor is formed. Sidewall structures are then formed adjacent to the NMOS transistor gate region. The source and drain implant processes used to form the NMOS transistor source and drain regions is then performed. This source and drain implant process is therefore self-aligned to the edge of the sidewall regions. The varactor structure shown in FIG. 2(a) is shown without sidewall structures for clarity. In general, the varactor structure will have sidewall structures. In this case sidewall structures 57 are formed adjacent to the gate layer 50 using standard semiconductor processing and illustrated in FIG. 2(b). This standard sidewall processing includes forming a conformal film comprising silicon nitride or silicon oxide over the gate layer and substrate. The conformal film is then etched using an anisotropic etch process to form the sidewall structures 57. Following the sidewall formation process, the heavily doped contact regions 35 are formed as described above. In general the varactor structure in FIGS. 2(a) and 2(b) will not have lightly doped drain and source extension regions. However such drain and source extension regions can be added to the varactor structure of the instant invention if required.

Following the formation of the varactor structure, contact structures 70 are formed to contact the gate layer 50. In forming the contact structures 70, a PMD layer is formed over entire varactor structure. As described above, contact holes are formed in the PMD layer and conductive plugs are used to fill the contact holes to contact the gate layer 50. As illustrated in FIGS. 2(a) and 2(b), in an embodiment of the instant invention, these contact structures 70 are formed over the contact isolation structure 32. By forming the contact structures 70 over the contact isolation structure 32 of the varactor, the parasitic resistance which was present in the prior art is reduced or eliminated. Reducing the parasitic resistance in the varactor will increase the quality factor Q. This reduction in resistance will become increasingly important as the frequency of the signals used in the varactor increases.

In normal operation, the substrate surface of the active regions of the varactor 60 and 65 will change state depending on the voltage difference applied between the gate layer 50 and the heavily doped contact region 35. Depending on the substrate doping type (i.e., n-type or p-type) and voltage applied, the substrate surface in the active regions 60 and 65 will be either in a depletion state, an accumulation state, or a inversion state. The active region of the varactor can therefore be defined as that region of the substrate (or well region) where a substantial portion of the depletion region, accumulation region, or inversion regions exist.

Figure 3A:
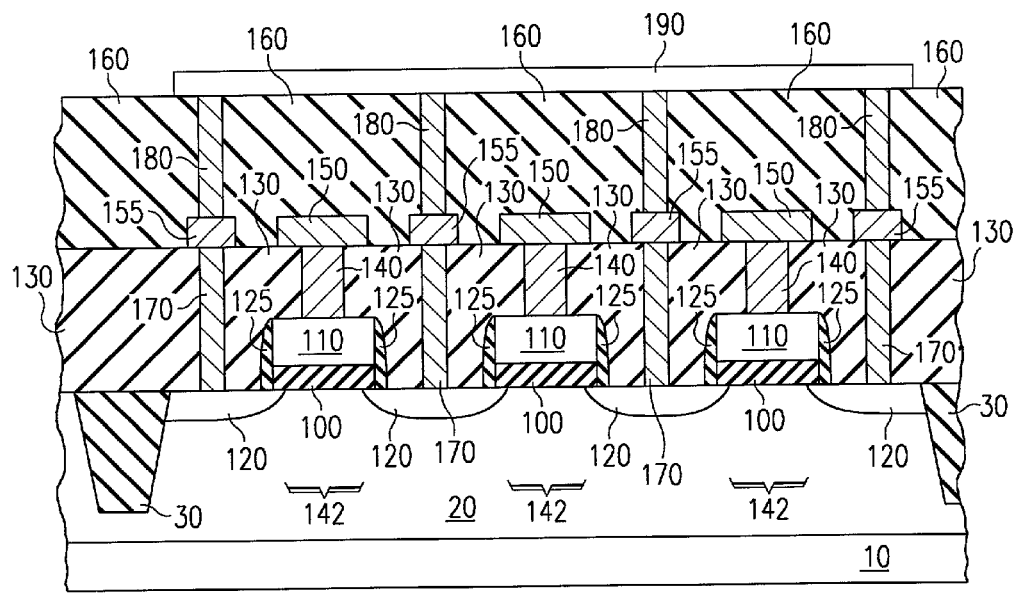
FIGS. 3(a)–(c) are cross-section diagrams showing a MOS varactor according to a further embodiment of the instant invention.
Figure 3B:
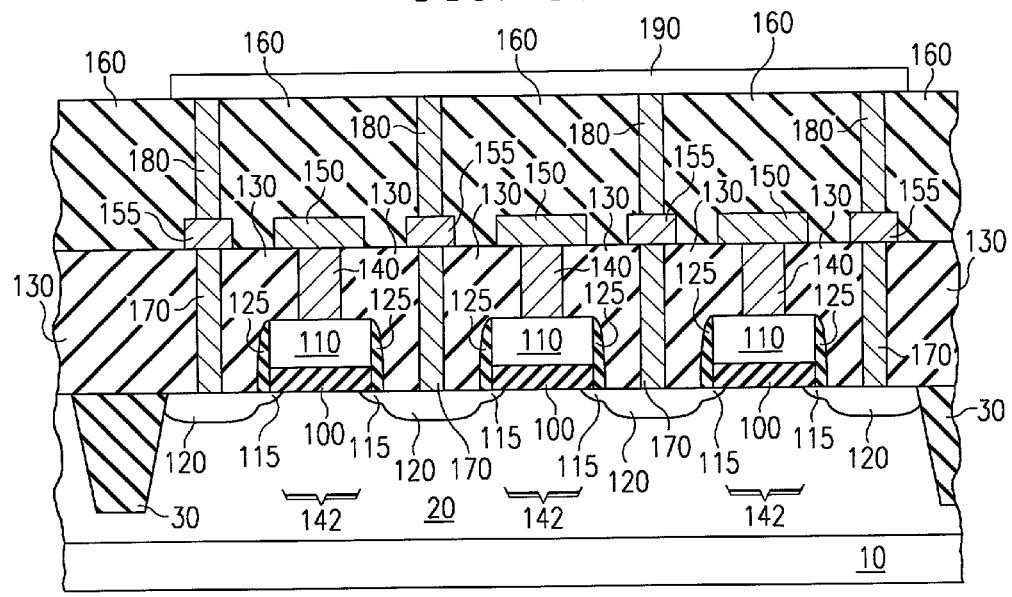

Shown in FIG. 3(a) is a further embodiment of the instant invention. Here a n-well region 20 is formed in a p-type substrate 10. Isolation structures 30 are formed in the n-well region as described above. The contact heavily doped contact regions 120 are formed in the n-well region following the formation of the gate dielectric layer 100, the conductive gate layer 110, and the sidewall structures 125. This structure does not have drain and source extension regions. The n-type heavily doped contact regions 120 can be formed simultaneously with the source and drain regions for a NMOS transistor using the same ion implantation processes. Shown in FIG. 3(b) is the varactor structure shown in FIG. 3(a) with the additional features of a drain and source extension region 115. The formation of this drain and source extension region 115 is described above.

Figure 3C:
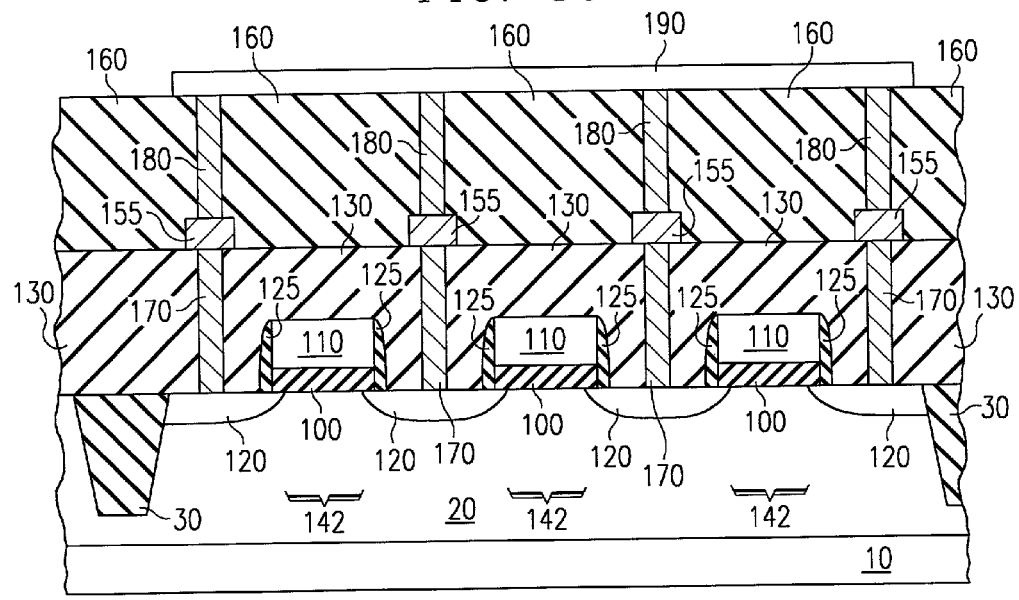

Following the formation of the varactor structure, a contiguous PMD layer 130 is formed above the gate layers 110 and the contact regions 120. Contact holes are formed in the PMD layer and a conducting material(usually tungsten, aluminum, titanium, copper, and other suitable metals and alloys) is used to fill the contact holes to provide gate layer contacts 140 (or electrical contacts) and contact region contacts 170. In an embodiment, the gate layer contacts 140 are formed over the active regions 142 of the varactor. Forming the gate layer contacts 140 over the active regions 142 (and thus over the n-well region) reduces the parasitic resistance associated with the varactor and therefore increases the capacitance ratio $V_R$. In a further embodiment, the gate layer contacts can be formed over isolation regions and not over active region of the device structure. This will apply to the structures shown in FIGS. 3(a) and 3(b) (i.e. without and with the drain and source extension regions 115). This is shown in FIG. 3(c) for the case without a drain source extension region 115. Following the formation of the gate layer contacts, a further conducting material is then formed and patterned on the PMD layer to provide a first network of conducting interconnects for the various contacts on the circuit. Patterned conductor lines are used to interconnect the gate layers 150 and the contact regions 155 to other regions of the integrated circuit. A second dielectric layer 160 is formed above the first conducting layers 150, 155 and the PMD layer 130. Via holes are then formed in the second dielectric layer 160 which are filled with a conducting material (usually tungsten, aluminum, titanium, copper, and other suitable metals and alloys) to provide electrical contact to the patterned conducting layers 150 and 155. A second patterned conducting layer 190 is then formed over the second dielectric layer 160 to provide further interconnects. Additional dielectric layers can be formed above the second dielectric layer is further levels of connectivity are required.

Figure 4:
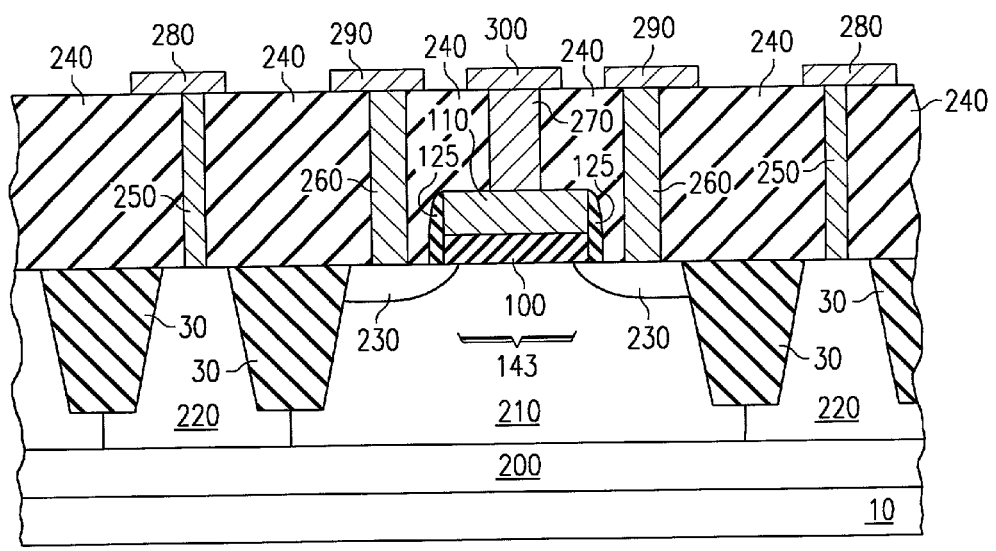
FIG. 4 is a cross-section diagram showing a MOS varactor according to a further embodiment of the instant invention.

Shown in FIG. 4 is a further embodiment of the instant invention where the varactor structure is formed in an isolated p-type region 210 in the semiconductor substrate. In forming the embodiment shown in FIG. 4, isolation structures 30 are formed in the substrate as described above. A deep n-well region 200 is formed in the substrate to provide isolation for the p-well region 210 that will contain the varactor structure. The p-well region 210 is formed by first forming a patterned masking film on the substrate followed by ion implanting p-type dopant species into the substrate to form the p-well region 210. The n-well regions 220 which will be used to provide contact to the deep n-well region 200, are formed by implanting n-type dopant species into the substrate through a patterned mask. The gate dielectric layer 100, the gate layer 110, and the sidewall structures 125 are formed as described above. The contact regions can be formed simultaneously with source and drain regions of the PMOS transistors which will be present on the integrated circuit. Alternatively, the p-type contact regions 230 can be formed independently. Following the formation of the PMD layer 240, the gate layer contacts 270 and the contact region contacts 260, and the deep n-well contacts 250 are formed as described above. The gate layer contacts 270 are formed over the active area 143 of the varactor. As described above, the varactor active area 143 can be defined as that region of the varactor where a substantial portion of the depletion region, accumulation layer, or the inversion layer will exist. In addition to the above described process, extension regions can be added to the varactor structure shown in FIG. 4 by implanting p-type dopant species into the substrate after the gate layer 110 is formed.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a low resistance semiconductor varactor, comprising
    providing a semiconductor substrate with at least a first isolation region and a second isolation region separated by a first distance;
    forming a well region of a first conductivity type in said semiconductor substrate between said first isolation region and said second isolation region;
    forming at least a first and second active regions in said well region by forming a contact isolation structure in said well region between said first isolation region and said second isolation region;
    forming contact regions of the first conductivity type in said first and second active regions;
    forming a gate dielectric layer on said first active region and said second active region;
    forming a gate layer on said gate dielectric layer wherein said gate layer overlies said first active region, said second active region, and said contact isolation structure; and
    forming electrical contacts to sad gate conductive layer wherein said electrical contacts are formed over said contact isolation structure.

2. The method of claim 1 wherein said first and second isolation regions comprise STI structures.

3. The method of claim 1 wherein said contact isolation structure comprises a STI structure.

4. A method of forming a semiconductor varactor, comprising:
    forming a well region of a first conductivity type in a semiconductor substrate;
    forming a gate dielectric layer on said well region;
    forming a gate layer on said gate dielectric layer;
    forming contact regions of the first conductivity type in said well region of a first conductivity type wherein said contact regions are formed using a source and drain region implantation formation process; and
    forming gate layer contacts to said gate conductive layer wherein said gate layer contacts overlie an isolation region.

5. The method of claim 4 further comprising forming sidewall structures adjacent to said gate layer.

6. The method of claim 5 wherein said well region is n-type.

7. The method of claim 5 wherein said well region is p-type.

* * * * *